(12) United States Patent
Ravazzini (10) Patent No.: US 6,556,480 B2
(45) Date of Patent: Apr. 29, 2003

(54) EEPROM CIRCUIT, IN PARTICULAR A MICROCONTROLLER INCLUDING READ WHILE WRITE EEPROM FOR CODE AND DATA STORING

(75) Inventor: Roberto Ravazzini, Agrate Brianza (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/033,718

(22) Filed: Dec. 28, 2001

(65) Prior Publication Data

US 2002/0097605 A1 Jul. 25, 2002

(30) Foreign Application Priority Data

Dec. 29, 2000 (EP) .................................. 830871

(51) Int. Cl.[7] ...................... G11C 16/04; G11C 14/00; G11C 16/06
(52) U.S. Cl. ...................... 365/185.18; 365/185.05; 365/185.08; 365/185.09
(58) Field of Search .................. 365/185.18, 185.05, 365/189.09, 230.08

(56) References Cited

U.S. PATENT DOCUMENTS

| | | | | |
|---|---|---|---|---|
| 5,459,733 A | * | 10/1995 | Alapat | 714/718 |
| 5,566,685 A | * | 10/1996 | Litovitz et al. | 128/898 |
| 6,145,069 A | * | 11/2000 | Dye | 711/170 |
| 6,282,136 B1 | * | 8/2001 | Sakurai et al. | 365/203 |
| 6,381,670 B1 | * | 4/2002 | Lee et al. | 711/103 |
| 2001/0014031 A1 | * | 8/2001 | Tanaka | 365/110 |
| 2002/0051383 A1 | * | 5/2002 | Mangan et al. | 365/185.11 |

* cited by examiner

Primary Examiner—David Nelms
Assistant Examiner—Ly Duy Pham
(74) Attorney, Agent, or Firm—Lisa K. Jorgenson; Robert Iannucci; Seed IP Law Group PLLC (57) ABSTRACT

Presented is an EEPROM circuit comprising: a program array of a matrix of EEPROM cells arranged in columns and rows, a data array of a matrix of EEPROM cells arranged in columns and rows, the cells of the program and data array capable of being written, read, and erased; a reference voltage circuit coupled to the program array capable of producing voltages used to write to and erase data from the program array; a current generation circuit coupled to the program array for supplying current to the program array in operation. Advantageously according to the invention, the reference voltage circuit and the current generation circuit are additionally coupled to the data array. Moreover, the EEPROM circuit further comprises means for selectively connecting at least one of the rows of the program array to one of the rows of the data array, and for selectively connecting at least one of the columns of the program array to one of the columns of the data array.

17 Claims, 7 Drawing Sheets

EEPROM CIRCUIT, IN PARTICULAR A MICROCONTROLLER INCLUDING READ WHILE WRITE EEPROM FOR CODE AND DATA STORING

BACKGROUND OF THE INVENTION

1. Field of the Application

The present invention is directed toward an EEPROM circuit, in particular a microcontroller that includes an EEPROM for storing program code and data that is capable of being written to and read from simultaneously. More specifically, the present invention relates to an EEPROM circuit comprising:

a program array of a matrix of EEPROM cells arranged in columns and rows, a data array of a matrix of EEPROM cells arranged in columns and rows, said cells of said program and data array capable of being written, read, and erased;

a reference voltage circuit coupled to said program array capable of producing voltages used to write to and erase data from said program array; and a current generation circuit coupled to said program array for supplying current to said array in operation.

2. Description of the Related Art

Many microcontrollers require embedded non-volatile memory blocks to store the system code, or programs that the microcontrollers execute. For some applications, a ROM memory can be used to store this system code, but this prohibits later changes from being made to the code. If the system code needs to be changed, a flash PROM is sometimes used.

Additionally, many microcontrollers store data from computation results. In this case, use of an EEPROM is preferred, rather than the flash PROM used above, because of the ability to selectively delete some of the data stored That is, using an EEPROM, it is possible to delete only a portion of the previously stored data while leaving the desired data untouched. Flash PROMs do not have this sectional erase capability.

If a particular microcontroller requires an EEPROM for a data storage section, then the non-volatile memory that stores the system code must also be an EEPROM, because it is prohibitively expensive and inconvenient to produce both an EEPROM and a Flash PROM on a single substrate for the microcontroller. It is expensive to produce such a chip because the processes that make EEPROMs and Flash PROMs are vastly different and incompatible with one another. Therefore, in those microcontrollers that store both programs and data, because the data storage cells must be EEPROMs, the program storage cells must also be EEPROMs.

Microcontrollers that have two EEPROM sections normally have two complete and separate EEPROM macrocells. An EEPROM macrocell is a preformatted layout scheme that includes all of the necessary circuit sections for proper EEPROM operation. It includes a set of HV latches in which data to be programmed are temporarily latched prior to programming them into the EEPROM cells. It also includes a charge pump for generating the high voltages necessary to program and erase the EEPROM cells.

It would be impossible to use a single EEPROM section to store both the system code and stored data from the computation results because of different functionality needed for these two processes. The system code portion needs to be executed (read) at the same time that data is being written (programmed). In conventional systems, this is impossible, because one task would have to wait for the other. It takes about 4/5 ms to program data into an EEPROM, during which time the system code could not be read. That time period is an impossibly long time period to have the microprocessor sit idle because no further portions of the system code could be read while data was being written. If the microprocessor was forced to be idle for this time period, it could not service interrupts during the entire 4/5 ms time period. Many systems specify that interrupts must be serviced much faster than 4/5 ms, thus the system code and data must be stored separately so that they can be accessed separately.

Requiring two separate EEPROM macrocell blocks causes inefficiency, however. As noted above, most current designs use pre-made macroblocks to reduce design cost. That is, instead of creating a complete EEPROM portion from nothing, a standard cell library is used. In the case where two EEPROM portions are used, such as where both the system code and the data need to be in EEPROM blocks, using two standard macrocells causes many inefficiencies. One inefficiency is that typically the data EEPROM is much smaller than the EEPROM used to store the system code. Thus, using two identical preformatted macroblocks results in one EEPROM being underutilized. For example, a standard EEPROM macrocell may be 8 k in size, with 32 columns. That would mean there are 256 rows in that standard macrocell. It would be fairly easy to change this standard macrocell to be smaller, such as to 128 bytes, by simply removing the unnecessary rows. However, in that case, the charge pump and HV latches would be much larger than they would necessarily have to be, because they were originally designed to handle 32 columns and 256 rows, but are now only being used for 4 rows. The data storing EEPROM macrocell can be redesigned and optimized for efficiency to its size, for instance, by reducing the size of the charge pump and reducing the number of columns, but redesigning the smaller EEPROM results in an inefficiency that was hoped to be avoided by using the macrocell in the first place.

The technical problem addressed by this invention is to provide an EEPROM that can have data written to a data memory array at the same time that data is read from a program memory array.

BRIEF SUMMARY OF THE INVENTION

An embodiment of the present invention provides a single macrocell that can perform Read While Write (RWW) functions. Data and program (system code) memory space is provided in a single macrocell designed to eliminate redundant components.

The macrocell includes two memory arrays, one for storing data, and one for storing the system code, or program. A charge pump for high voltage generation and high voltage latches remain similar to that of a single macrocell, but are shared across both the program and data memory arrays.

Presented is an EEPROM circuit of the type described above and comprising:

a program array of a matrix of EEPROM cells arranged in columns and rows;

a data array of a matrix of EEPROM cells arranged in columns and rows, said cells of said program and data array capable of being written to, read from, and erased;

a reference voltage circuit coupled to said program array capable of producing voltages used to write to and erase data from said program array;

a current generation circuit coupled to said program array for supplying current to said program array in operation; wherein said reference voltage circuit and said current generation circuit are additionally coupled to said data array; and means for selectively connecting at least one of the rows of said program array to one of the rows of said data array, and for selectively connecting at least one of the columns of said program array to one of the columns of said data array.

Also presented is a method of operating an EEPROM circuit of the type described above, the EEPROM circuit comprising:

a program array of a matrix of EEPROM cells arranged in columns and rows, a data array of a matrix of EEPROM cells arranged in columns and rows, said cells of said program and data array capable of being written, read, and erased;

a reference voltage circuit coupled to said program and data arrays capable of producing voltages used to write to and erase data from said arrays;

a current generation circuit coupled to said program and data arrays for supplying current to said arrays in operation, the method comprising:

accepting signals to the EEPROM circuit for writing data to said program array and writing data to said program array;

accepting signals to the EEPROM circuit for writing data to said data array and writing data to said data array;

accepting signals to the EEPROM circuit for reading data from said program array and reading data to said program array;

accepting signals to the EEPROM circuit for reading data from said data array and writing data to said data array; and accepting signals to the EEPROM circuit for reading data from said program array while writing data to said data array and simultaneously writing data to said data array while reading data from said program array.

BRIEF DESCRIPTION OF THE SEVERAL VIEWS OF THE DRAWINGS

The characteristics and advantages of the device according to the invention will be seen from the description, following herein, of an embodiment given as an indication and not limiting with reference to the attached drawings in which.

DETAILED DESCRIPTION OF THE INVENTION

Figure 1:
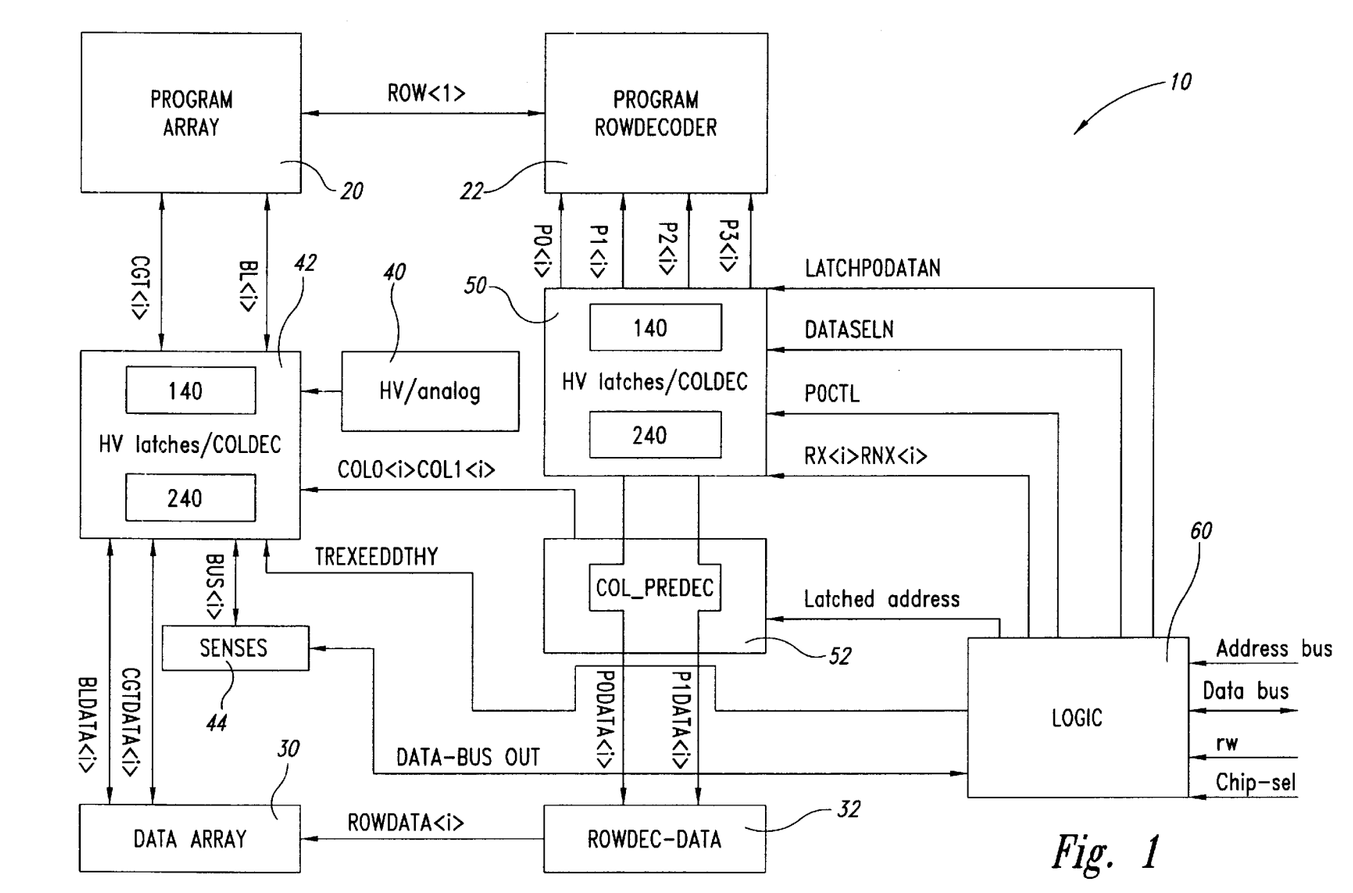
FIG. 1 shows a block diagram of an EEPROM structure according to the present invention.

Shown in FIG. 1 is a block diagram of an EEPROM memory architecture 10 according to an embodiment of the present invention. Main blocks of the memory architecture 10 are shown along with their interconnections.

The inventive EEPROM circuit 10 includes a program array 20 and a data array 30 of EEPROM memory cells, each formed in a matrix of rows and columns. These arrays are used to store the system code and the temporary data stored in a microcontroller, respectively. Each of the arrays 20, 30 are coupled to a decoder in a standard fashion. There is a program row decoder 22 for the program array 20, and a data row decoder 32 for the data array 30.

Also included in the circuit 10 are a set of high voltage analog circuits 40, which include a reference voltage circuit 40A and a current generator 40B. In one embodiment, this can include a band-gap reference circuit, and a charge pump, respectively. The set of high voltage analog circuits 40 is coupled to an interaction circuit 42 including a set of HV latches and a column decoder. The HV latches of the circuit 42 include a bit-line latch 140 and a control gate (CG) line latch 240 as described below with respect to FIGS. 3 and 5. The column decoder portion of the interaction circuit 42 is a multiplexer as also described in greater detail below. The interaction circuit 42 is coupled to both the program array 20 and the data array 30. In this way, the interaction circuit 42 services both arrays 20, 30, and the need for independent interaction circuits for each array, as is required by the prior art, is eliminated.

The interaction circuit 42 is also coupled to a set of sense amplifiers 44, which are used for both the program array 20 and the data array 30. In one embodiment, eight sense amplifiers are included in the set of sense amplifiers 44 for use providing an eight bit output.

Also included in the EEPROM circuit 10 are a set of row predecoders 50 and a set of column predecoders 52. The row predecoders 50 couple to both the program row decoder 22 and the data row decoder 32, and include a standard predecoder 300 and a modified predecoder 330 as described with reference to FIGS. 6 and 7 below. The set of column predecoders 52 is coupled to the interaction circuit 42, which in turn is coupled to the program array 20 and the data array 30.

Further, the inventive EEPROM circuit 10 includes a logic interface 60 used to interface with signals of a microcontroller.

Figure 2:
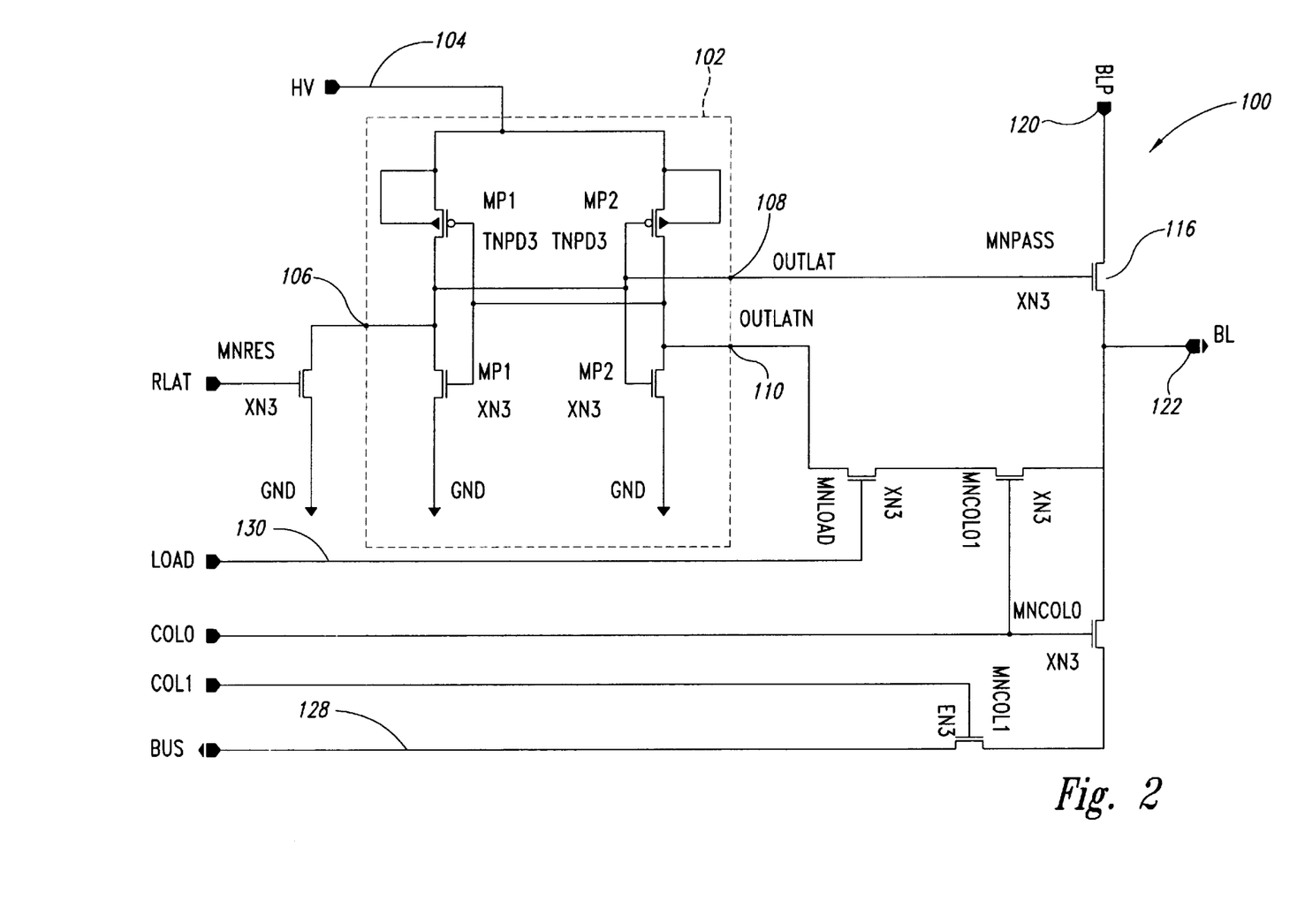
FIG. 2 schematically shows a high voltage latch according to a standard EEPROM cell.

One of the major differences in the EEPROM circuit 10 from those of the prior art concerns the interaction circuit 42, which is made from HV latches and a column decoder. A standard HV latch 100 for a conventional macrocell is shown in FIG. 2. The standard HV latch 100 includes a typical latch structure 102, supplied by a high voltage HV 104 and having an input node 106. The latch structure 102 has an output 108 and a negated output 110.

The output 108 of the latch structure 102 is coupled to the control gate of a pass transistor 116. This pass transistor 116 is used to couple a high voltage for programming (shown as BLP 120) to a bit line BL 122 that is coupled to the HV latch 100. In the embodiment shown in FIG. 2, the pass transistor 116 is an NMOS transistor, so the high voltage BLP 120 is connected to the bit line BL 122 when the latch is set, so that the output 108 of the latch structure 102 is HIGH.

During "read" mode, every latch structure 102 coupled to the specific bit lines 122 are in the reset state. In that state, the output 108 of the latch structure 102 is LOW. This keeps the pass transistor 116 OFF, which in turn keeps the high voltage BLP 120 separated from the bit lines BL 122. In this condition, the bit lines BL 122 are instead coupled to the respective column decoders, which reduce the necessary size of the array, for instance, to 8 bits for an 8 bit bus. Additionally, sense amplifiers are coupled to a bus 128 for reading the data from the cells over the bit lines BL 122.

During "write" mode, the same bus 128 is used when the data stored in the HV latches are required to be written. In this situation, a load signal 130 activates to HIGH and the bus 128 is kept to 0 if the latch structure 102 is desired to be set (output 108 HIGH), and is kept at 1 if the latch is desired to be kept in the reset state (output 108 LOW).

In a preferred embodiment, the EEPROM circuit 10 (FIG. 1) allows reading of the program array 20 while writing to the data array 30, but not vice-versa. It would be within the knowledge of one skilled in the art to reverse these requirements, and to make either array available while writing to the other. However, in a microprocessor, it is necessary to read program code while writing data, and not vice-versa, so the preferred embodiment shown in FIG. 1 will most often be implemented.

Figure 3:
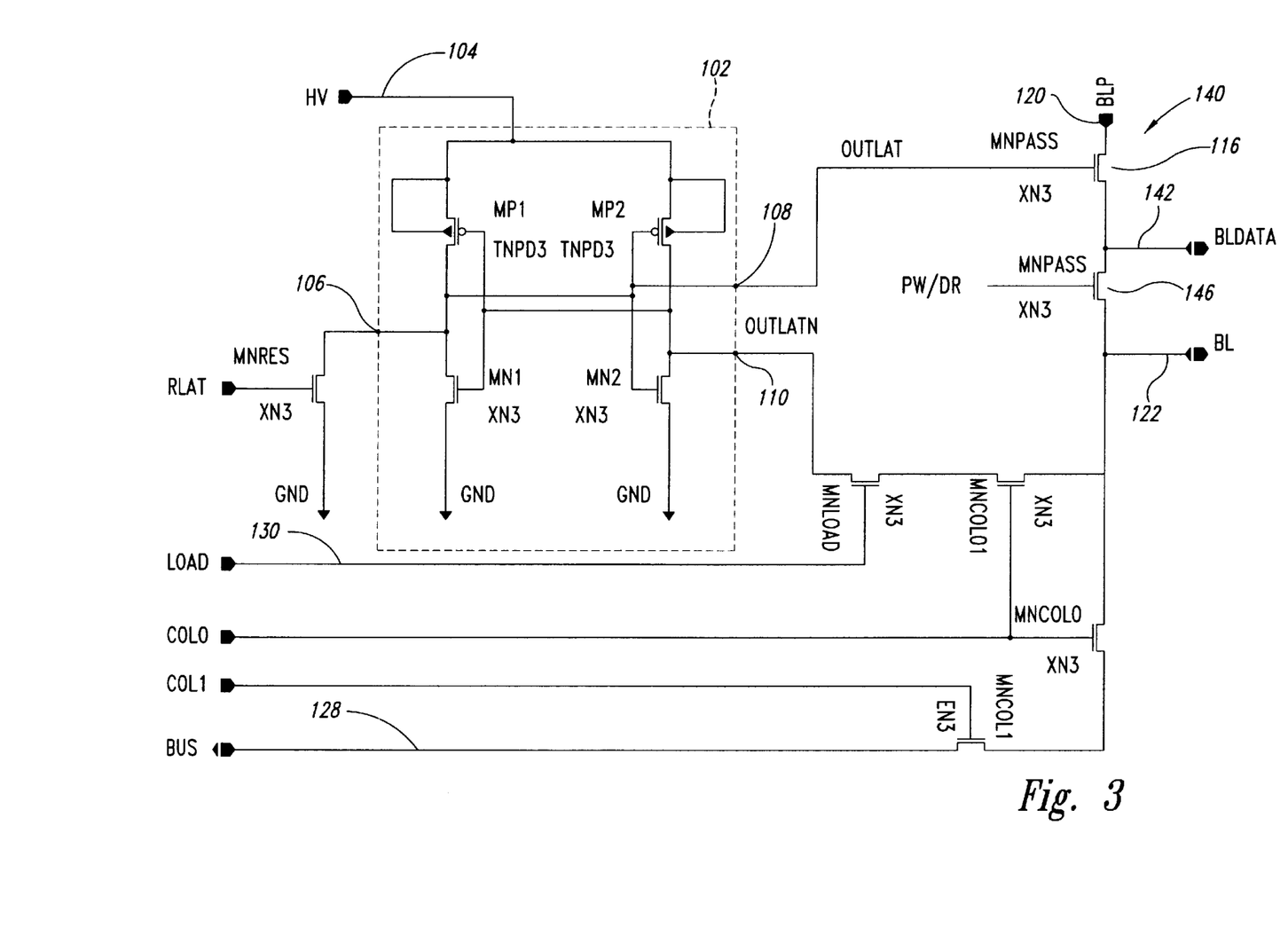
FIG. 3 schematically shows a high voltage latch according to the EEPROM structure shown in FIG. 1.

A modified HV latch 140, as used as a component of the interaction circuit 42 of FIG. 1, is shown in FIG. 3. In FIG. 3, the HV latch 140 is similar to the HV latch 100 of FIG. 2. A difference lies with the addition of an extra coupling transistor 146 that couples the bit line for the program array, BL 122, with a bit line for the data array, BLDATA 142, when the coupling transistor is driven by a PW/DR signal. The PW/DR signal stands for program write/data read and is used when either of these conditions are true, as further described below. The program bit line BL 122 is directly coupled to the read-path, while data memory is directly connected to the write-path. In this way, when the coupling transistor 146 is OFF, the bit line BLDATA 142 can simultaneously be coupled to the high voltage line BLP 120 (for programming (writing)) from the high voltage analog circuits 40 while the bit line BL 122 is coupled to the bus 128 for reading. The coupling transistor 146 in effect "decouples" these circuits from one another when the PW/DR signal is OFF.

Figure 4:
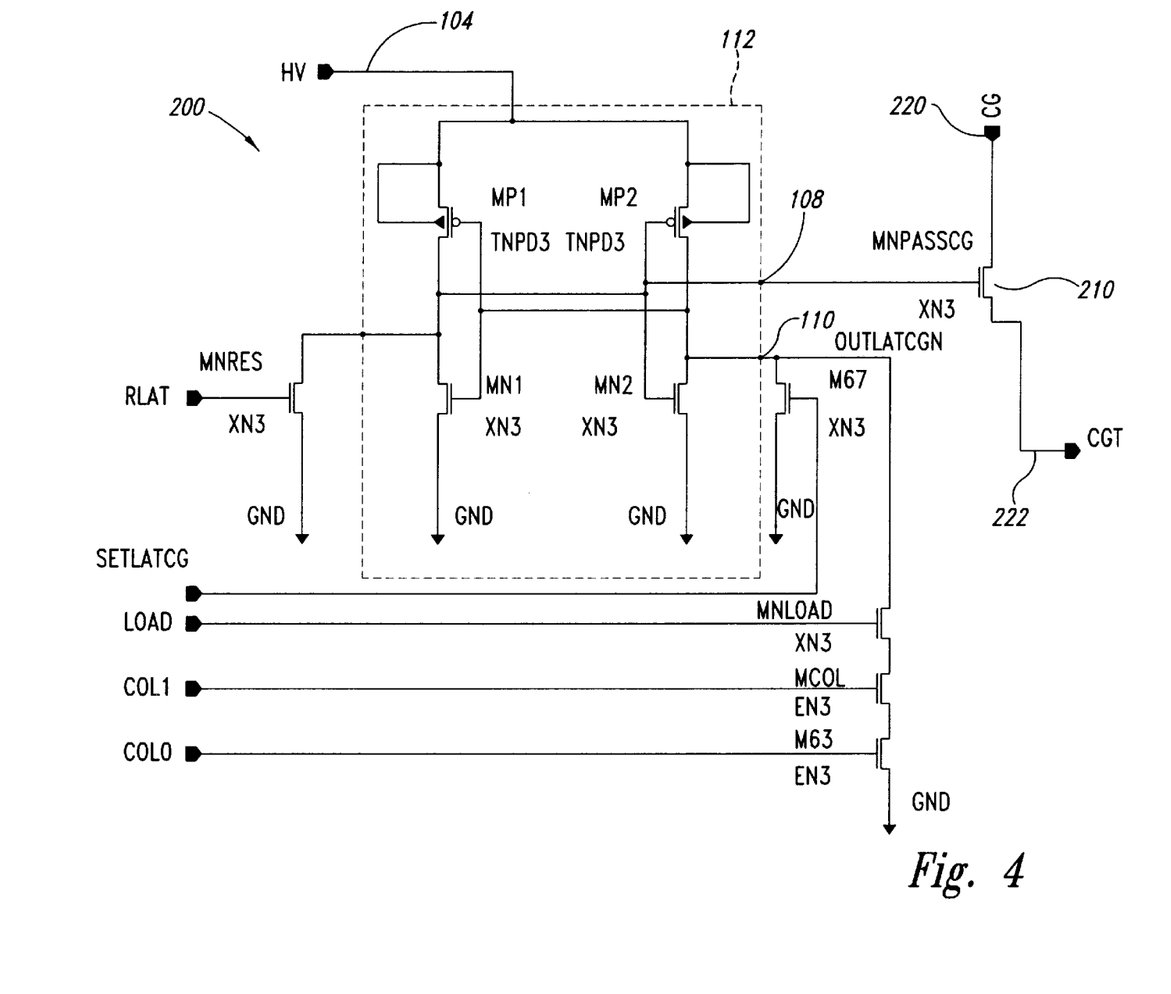
FIG. 4 schematically shows a control-gate line latch according to a standard EEPROM cell.
Figure 5:
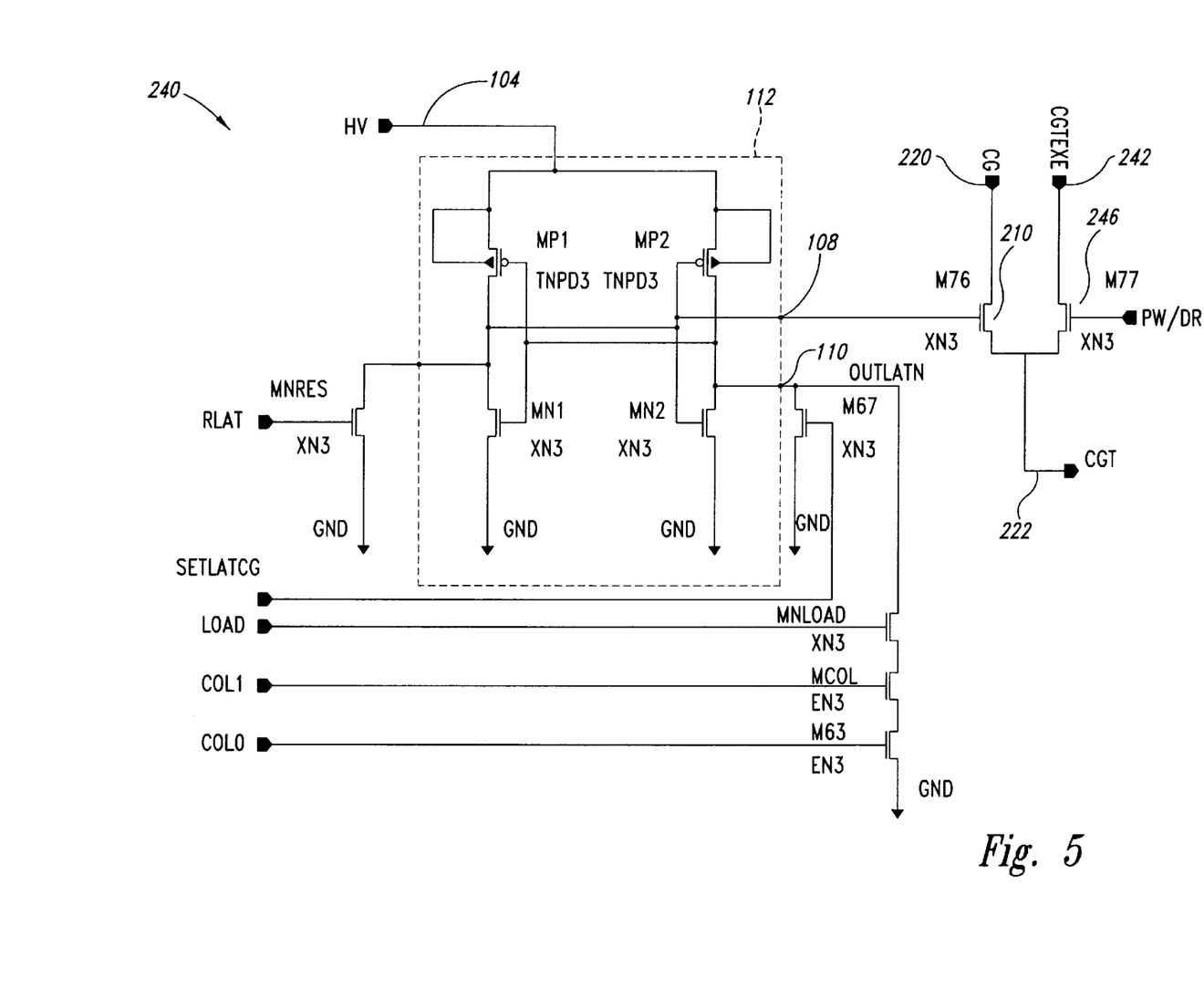
FIG. 5 schematically shows a control-gate line latch according to the EEPROM structure shown in FIG. 1.

Another set of HV latches are located on the control-gate line latch, and are shown in FIG. 4 (a standard HV latch 200) and FIG. 5 (the inventive latch 240).

In FIG. 4, the standard HV latch 200 includes the same typical latch structure 102 as shown in FIGS. 2 and 3. The output 108 of the latch structure 102 controls a pass transistor 210, which is coupled between a high voltage node CG 220 and a program control gate line CGT 222. The remainder of the HV latch 200 is similar but not identical to the HV latch 100 of FIG. 2.

FIG. 5 shows the inventive HV latch 240, which is similar to the standard HV latch 200 of FIG. 4, but also contains an additional pass transistor 246 that connects the control gates of the program array CGTEXE 242 to the high voltage node CG 220 only when programming is requested in the programming array 20 (FIG. 1). The PW/DR signal that drives the additional pass transistor 246 is the same signal that also drives the extra coupling transistor 146 in FIG. 3.

The connection between program and data bit lines 122 BL and 142 BLDATA (FIG. 3), and also the connection between the data and program CG lines CGT222 and CGTEXE 242 (FIG. 5) is made when the PW/DR signal is HIGH, through the action of the pass transistors 146 and 246, respectively. The PW/DR signal that drives these pass transistors 146, 246 is generated by the logic interface 60 of FIG. 1. In particular, the PW/DR signal is HIGH when there is a request to program the program array 20, or when data is requested to be read from the data array 30.

With the configuration as shown in FIGS. 3 and 5 and as described above, while the program array 20 is being programmed, the data array 30 cannot be read. During this time period when the PW/DR signal is HIGH, the program array 20 and data array 30 are connected together. All of the rows in the data array 30 are grounded, so high voltages directed to the program array 20 don't reach any of the cells in the data array 30.

Additionally, the PW/DR signal is HIGH when data is read from the data array 30. During this phase, programming cells in the program array 20 is not possible. Even in this case, the program array 20 and data array 30 are connected together by the actions of the pass transistors 146 and 246. When data is requested to be read from the data array 30, all of the rows in the program array 20 are grounded to prevent any crossing of signals.

In other situations, the program and data arrays 20, 30 are not connected together. Reading from the program array 20 (prior to executing the system code) is possible even if data is being written in the data array 30 because bit lines and control gate lines are independent.

Another modification has been introduced on row-predecoder circuitry 50 of FIG. 1. In a RWW configured EEPROM, both precoder blocks 300 (FIG. 6), 330 (FIG. 7) are present in the row predecoder 50, while in a standard program EEPROM, only the standard predecoder 300 is present.

Figure 6:
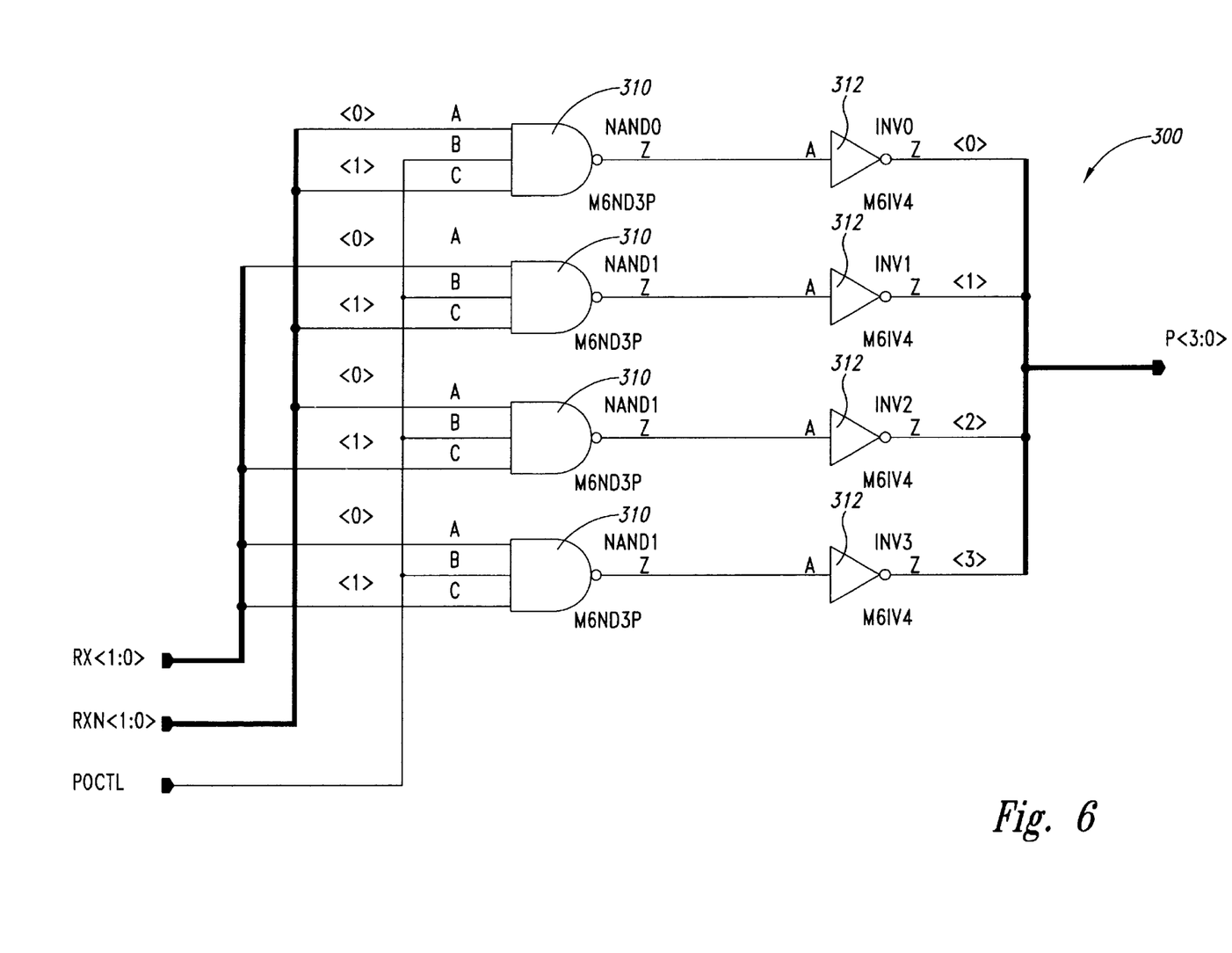
FIG. 6 shows a standard pre-coder according to a standard EEPROM cell.
Figure 7:
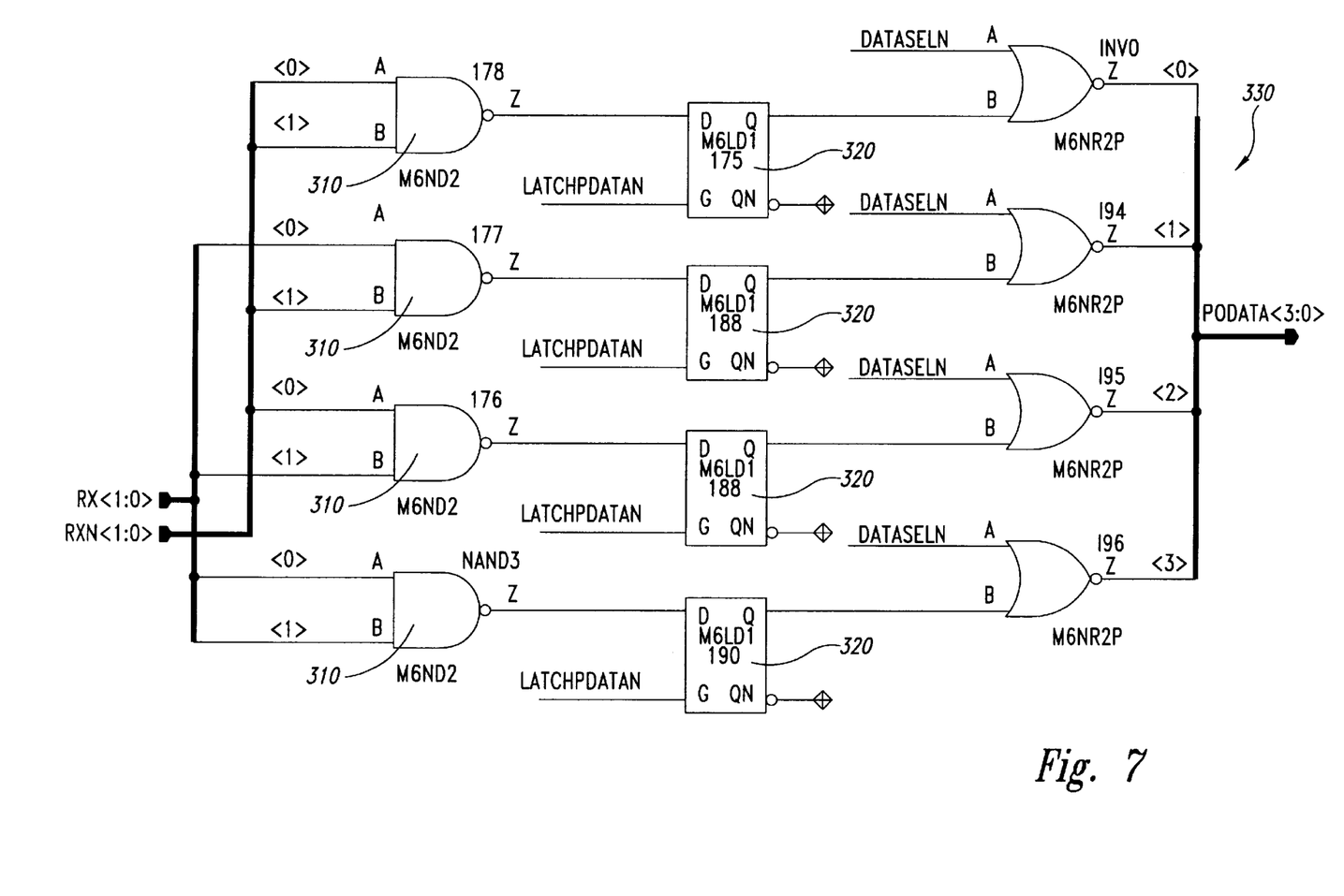
FIG. 7 shows a read while write pre-coder according to the EEPROM structure shown in FIG. 1.

In the FIGS. 6 and 7, predecoder signals have been named P<i>. The logical AND of P0<i>, P1<j>, P2<k>, P3<l>, constitutes the last stage of the rowdecoder. FIGS. 6 and 7 show the difference between generator of P0<i> signals for the program array 20 and P0DATA<i> signals for the data array 30.

RX(i) and RNX(i) are the row addresses buffered or inverted respectively. They are seen in both FIGS. 6 and 7. These row addresses are generated by a circuit that controls global programming, where all rows must be selected together. In this situation all RX and RNX are set to logic 1.

The standard predecoder circuit 300 of FIG. 6 is composed of normal AND of RX(i) signals through a set of NAND gates 310 and inverters 312. POCTL is a signal that disables all rows in the program array 20 when it is low (this situation is obtained with P0<i>=0 for each i). It is used to deselect all rows when the memory is not selected or when a reading operation is wanted in the data array 30. In this situation all rows in the program array 20 have to be grounded.

The modified predecoder 330 for the data array 30, shown in FIG. 7, introduces a series of latches 320, in addition to the NAND gates 310 of the predecoder circuit shown in FIG. 6. These latches 320 are necessary when the user is performing a writing operation in the data array 30. The latched row (where the programming operation will be done) must be the row on which all writing cycles are accomplished But during this phase, it is possible that reading cycles in the program array 20 are required and so RX(i) and RNX(i) can change. Therefore, latching row predecoder signals for the data array 30 is necessary for keeping track of last data-writing operation.

A signal LATCHPDATAN, which is an input to the latches 320, is used for this reason. This signal is HIGH (the not latching situation) when either only reading operations are required, or, if writing data to the data array 30, only after the address is stable and the data in the data array 30 is actually being written.

A signal DATASELN is the signal that forces all of the P0DATA<i> signals to 0, and therefore all rows in the data array 30 are grounded when the signal is present. All of the rows in the data array 30 are grounded when it is either not selected, or when a programming operation is required in the program array 20. In this case the program and data arrays 20, 30 are coupled together, but only the selected row in the program array 20 has to be selected.

It should be noted that, because the RX<i> and RNX<i> signals are common to both the program and data arrays 20, 30 it is not possible to simultaneously perform a global program in the data array 30 while the program array 20 is being read. Thus, the RWW feature enabled by the inventive EEPROM structure 10 is not available whenever a global operation is requested on all of the cells of the data array 30 (global request). This constraint is not really a large problem because global requests are normally only used during testing algorithms, and not during normal user-activities.

The proposed configuration is being implemented on 0.5 um FLOTOX EEPROM process. In that production, the size of the data array 30 is 128 bytes and the size of the program array 20 can be up to 8 kbytes. The gain in area-saving is about 19% for an 8 kb sized program array 20, and 37% for a 1 kbyte sized program array 20. These figures do not take into consideration the extra savings that can be realized from optimally designing a separate small EEPROM data array 30, but, as mentioned above, that process is time consuming and expensive in resources. With the present solution, the data array 30 can be made of rows identical to those in the program array 20, thereby also increasing the design efficiency by using a standard modular design.

From the foregoing it will be appreciated that, although specific embodiments of the invention have been described herein for purposes of illustration, various modifications may be made without deviating from the spirit and scope of the invention. Accordingly, the invention is not limited except as by the appended claims.

I claim:

1. An EEPROM circuit comprising:
a program array of a matrix of EEPROM cells arranged in columns and rows;
a data array of a matrix of EEPROM cells arranged in columns and rows, said cells of said program and data arrays being capable of being written to, read from, and erased;
a reference voltage circuit coupled to said program and data arrays and structured for producing voltages used to write to and erase data from said program array;
a current generation circuit coupled to said program and data arrays for supplying current to said program array in operation; and
means for selectively connecting at least one of the rows of said program array to one of the rows of said data array, and for selectively connecting at least one of the columns of said program array to one of the columns of said data array.

2. The EEPROM circuit of claim 1 wherein said means includes a high voltage latch including:
a latching circuit powered by a high voltage and having an input and a first output;
a programming line; and
means for coupling said programming line to columns in said data array and to columns in said program array, and, alternately, for coupling said programming line to said columns in said data array while simultaneously decoupling said programming line from said columns in said program array.

3. The EEPROM circuit of claim 2 wherein said means for coupling comprises a first (116) and a second (146) pass transistor, wherein said first output (108) of said latching circuit (140) controls said first pass transistor (116), and a second output of said latching circuit controls said second pass transistor.

4. The EEPROM circuit of claim 3 wherein said second output is active when data is being written to said program array or when data is being read from said data array.

5. The EEPROM circuit of claim 1, wherein said means includes a high voltage latch including:
a latching circuit powered by a high voltage and having an input, an output;
a programming line; and
means for coupling said programming line to rows in said data array and to rows in said program array, and, alternately, for coupling said programming line to said rows in said data array while simultaneously decoupling said programming line from said rows in said program array.

6. The EEPROM circuit of claim 5 wherein said means for coupling comprises a first and a second pass transistor, wherein said first output of said latching circuit controls said first pass transistor, and a second output of said latching circuit controls said second pass transistor.

7. The EEPROM circuit of claim 1, further comprising a row predecoder circuit coupled to the program and data arrays, the row predecoder including a plurality of latches coupled to the rows of the data array, respectively, the latches being structured to store an indication of whether a corresponding row of the data array is being written to.

8. An EEPROM circuit comprising:
a program array of a matrix of EEPROM cells arranged in columns and rows;
a data array of a matrix of EEPROM cells arranged in columns and rows, said cells of said program and data arrays being capable of being written to, read from, and erased;
a reference voltage circuit coupled to said program and data arrays and structured for producing voltages used to write to and erase data from said program array;
a first switch positioned between the reference voltage circuit and one of the columns of the data array and structured to selectively electrically connect a first reference voltage from the reference voltage circuit to the one of the columns; and
a second switch positioned between the one of the columns of the data array and a corresponding column of the program array and structured to selectively electrically connect the one of the columns of the data array and the corresponding column of the program array.

9. The EEPROM circuit of claim 8, further comprising:
a third switch positioned between the reference voltage circuit and one of the rows of the data array and structured to selectively electrically connect a second reference voltage from the reference voltage circuit to the one of the rows; and
a fourth switch positioned between the one of the rows of the data array and a corresponding row of the program array and structured to selectively electrically connect the one of the rows of the data array and the corresponding row of the program array.

10. The EEPROM circuit of claim 9 wherein the second and fourth switches have respective control terminals that are coupled to each other and to a control signal.

11. The EEPROM circuit of claim 8, further comprising a high voltage latch that includes:

a latching circuit powered by a high voltage and having an input and first and second outputs;

a programming line; and means for coupling said programming line to rows in said data array and to rows in said program array, and, alternately, for coupling said programming line to said rows in said data array while simultaneously decoupling said programming line from said rows in said program array.

12. The EEPROM circuit of claim 11 wherein said means for coupling comprises first and second pass transistors, wherein said first output of said latching circuit controls said first pass transistor, and said second output of said latching circuit controls said second pass transistor.

13. The EEPROM circuit of claim 8, further comprising a row predecoder circuit coupled to the program and data arrays, the row predecoder including a plurality of latches coupled to the rows of the data array, respectively, the latches being structured to store an indication of whether a corresponding row of the data array is being written to.

14. An EEPROM circuit comprising:

a program array of a matrix of EEPROM cells arranged in columns and rows;

a data array of a matrix of EEPROM cells arranged in columns and rows, said cells of said program and data arrays being capable of being written to, read from, and erased;

a reference voltage circuit coupled to said program and data arrays and structured for producing voltages used to write to and erase data from said program array;

a first switch positioned between the reference voltage circuit and one of the rows of the data array and structured to selectively electrically connect a first reference voltage from the reference voltage circuit to the one of the rows; and a second switch positioned between the one of the rows of the data array and a corresponding row of the program array and structured to selectively electrically connect the one of the rows of the data array and the corresponding row of the program array.

15. The EEPROM circuit of claim 14, further comprising a high voltage latch that includes:

a latching circuit powered by a high voltage and having an input and first and second outputs;

a programming line; and means for coupling said programming line to columns in said data array and to columns in said program array, and, alternately, for coupling said programming line to said columns in said data array while simultaneously decoupling said programming line from said columns in said program array.

16. The EEPROM circuit of claim 15 wherein said means for coupling comprises first and second pass transistors, wherein said first output of said latching circuit controls said first pass transistor, and said second output of said latching circuit controls said second pass transistor.

17. The EEPROM circuit of claim 14, further comprising a row predecoder circuit coupled to the program and data arrays, the row predecoder including a plurality of latches coupled to the rows of the data array, respectively, the latches being structured to store an indication of whether a corresponding row of the data array is being written to.

* * * * *